(12) United States Patent
Kaneko et al.

(10) Patent No.: US 6,615,402 B2
(45) Date of Patent: Sep. 2, 2003

(54) INTERCHANGEABLE FPGA-GATE ARRAY

(75) Inventors: Yoshio Kaneko, Kashiwa (JP); Atsushi Tomishima, Nagareyama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 72 days.

(21) Appl. No.: 09/817,153

(22) Filed: Mar. 27, 2001

(65) Prior Publication Data

US 2001/0027548 A1 Oct. 4, 2001

(30) Foreign Application Priority Data

Mar. 28, 2000 (JP) ........................................ 2000-088962

(51) Int. Cl.$^7$ ........................ G06F 17/50; H03K 17/693
(52) U.S. Cl. ............................. 716/16; 716/17; 326/39; 326/41; 326/47
(58) Field of Search ..................... 716/1–21; 326/37, 326/38, 39, 41, 47

(56) References Cited

U.S. PATENT DOCUMENTS

| | | | |
|---|---|---|---|
| 5,550,839 A | | 8/1996 | Buch et al. ............... 371/22.1 |
| 5,848,026 A | * | 12/1998 | Ramamurthy et al. ... 365/238.5 |
| 5,867,507 A | * | 2/1999 | Beebe et al. ............. 371/22.31 |
| 6,021,513 A | * | 2/2000 | Beebe et al. ................ 714/726 |
| 6,044,025 A | * | 3/2000 | Lawman ..................... 365/191 |
| 6,134,517 A | * | 10/2000 | Baxter et al. ................. 703/28 |
| 6,226,779 B1 | * | 5/2001 | Baxter et al. ................. 716/16 |
| 6,353,921 B1 | * | 3/2002 | Law et al. .................... 716/17 |

* cited by examiner

*Primary Examiner*—Vuthe Siek
(74) *Attorney, Agent, or Firm*—Oblon, Spivak, McClelland, Maier & Neustadt, P.C.

(57) ABSTRACT

A test facilitating circuit is contained in a FPGA-GATE ARRAY. In the gate array chip there are disposed I/O cells, a boundary scan circuit, a controller and an internal circuit. The arrangement of the external terminals of a package is the same as the arrangement of the external terminals of the FPGA. The test terminal corresponds to the data program terminal of the FPGA. When the FPGA is displaced with a gate array, the data program terminal of the FPGA becomes unnecessary and is used as a control terminal for the boundary scan circuit. The position of the test terminal is fixed, thereby to achieve a facilitated, automated and standardized design.

11 Claims, 5 Drawing Sheets

INTERCHANGEABLE FPGA-GATE ARRAY

CROSS-REFERENCE TO RELATED APPLICATIONS

This application is based upon and claims the benefit of priority from the prior Japanese Patent Application No. 2000-088962, filed Mar. 28, 2000, the entire contents of which are incorporated herein by reference.

BACKGROUND OF THE INVENTION

The present invention relates to a gate array having interchangeability with programmable devices (hereafter referred to as "FPGA") such as FPGAs (Field Programmable Gate Array) and PLDs (Programmable Logic Device).

Logic LSIs are divided, from the view of users, that is, according to the customizing grade, into standard logic LSIs, semi-custom LSIs and full-custom LSIs. Generally a standard LSI is one of which specifications are fixed between users, a full-custom LSI is one of which specifications are specific to each user, and a semi-custom LSI is one of which manufacturing processes are halfway common and of which subsequent manufacturing processes are specific to each user.

Moreover, logic LSIs are divided, according to their use, into general LSIs and specific LSIs. A specific LSI is called ASIC (Application Specific IC) and includes, for example, ASSPs (Application Specific Standard products) and ASCPs (Application Specific Custom products).

As a representative example of the ASIC a gate array is known. The gate array is a kind of semi-custom LSI and has advantages of the shortest development period among the ASCIs and low cost. In the gate array, as is well-known, a wafer having a transistor array (Diffused Wafer, hereafter referred to as DW) are formed in advance by using a common mask for a plurality of product types, and subsequently, by using this wafer and different wiring masks for various product types, LSIs having different functions can be realized.

On the other hand, in recent years, a FPGA is widely noticed as a logic LSI different from the ASIC. The FPEG is already completed as a chip, however, it doesn't operate as it is, and it is characterized in that a user can program data into a memory in the FPGA to realize a LSI (product) having desired functions. And in comparison to the ASICs such as gate arrays the FPGA has advantages of a very short period from design to completion of a product, free redesign and flexibly changeable specifications.

1. INTERCHANGEABILITY

In comparison to gate arrays realizing desired functions by means of a wiring process using wiring masks after design, the FPGA permits processes from design to completion of a product to be carried out for a short period.

On the other hand, the FPGA has a disadvantage of the unit price of a chip being very high (several times to several ten times of that of a gate array). Therefore, conventionally it is typical to reduce initial costs in a trial production stage by using a FPGA in which the period from design to completion of a product is very short and to reduce mass production costs in a mass production stage by using a gate array in which the unit price of a chip is low.

Now, recent progress in FPGA technology is remarkable, an increase in gate scale and an improvement in processing speed is being realized, and further, according to the demand of the market, a FPGA capable of selecting (or changing) the type of input/output buffers is beginning to be proposed.

As shown in FIG. 1, in a FPGA provided with input/output buffers having selectivity (diversity), a standard input/output circuit block (hereafter referred to as a standard I/O cell) 12 and a special input/output circuit block (hereafter referred to as a special I/O cell) 13 are disposed, for example, on the peripheral portion of a chip 11-1.

And almost every kind of input/output buffer (usual input/output buffer) can be realized by changing the functions of the buffer in the standard I/O cell 12 by means of a program. On the other hand, for example, in an input/output buffer of LVDS (Low Voltage Differential Signal) type, the specifications thereof are strictly specified, and the standard I/O cell 12 cannot deal with this buffer. Therefore, the input/output buffer of LVDS type is fixed in structure, size and layout and is realized by means of a buffer of which functions cannot be changed by means of a program, that is, by means of the special I/O cell 13.

Now, the gate array is formed by using a DW of which substrate process (transistor forming process) has already ended and further by carrying out a wiring process by means of a wiring mask specific to each product. Therefore, basically, an input/output buffer of LVDS type can be also realized by changing a wiring mask.

However, the gate array uses a transistor of given structure and size and realizes a desired logic LSI by changing the layout of metallic wiring freely. Therefore, it is very difficult to realize a buffer having substantially the same characteristics as the input/output buffer of LVDS type in the FPGA tip.

Accordingly, as a result thereof, in a FPGA having a special I/O cell 13 as described above, it is impossible to replace a FDPA used in the development stage with a gate array in the mass production stage.

That is, conventionally, in developing a logic LSI having a special input/output buffer of which characteristics are strictly specified or a system thereof, there are no other methods than to use a FPGA both in the development stage and in the mass production stage or to replace a FPGA used in the development stage with a full-custom LSI (such as standard cell and embedded array) using a specific wiring mask in the substrate process and the wiring process in the mass production stage.

Therefore, in the former method the mass production cost is very high, and in the latter method there are problems that the period from design to mass production of a full-custom LSI is long and that the development cost is also high.

2. TEST CIRCUIT FOR EASY TEST

Conventionally, in the gate array, tests on the part of the manufacturers are very complicated and difficult due to the complicated functions of a logic LSI. Therefore, the test time for shipping inspection carried out before shipping products becomes long and the production cost is also increasing. Thus, the manufacturers think that it is preferable to load a test circuit for an easy shipping inspection in the chip in order to shorten the test time.

However, since the problems Nos. 1 to 3 as describe below are caused by loading a test circuit for an easy test in the chip, many manufactures don't wish to load such a test circuit in the chip.

No. 1: chip size gets larger

That is, a test circuit for an easy test mounted in the chip makes the chip size larger.

No. 2: processing speed gets lower

That is, a gate circuit for changing over signals inserted between the input/output circuit and the logic circuit makes the processing speed lower.

No. 3: unnecessary external terminals (pins) get added

A test terminal (external terminal) is required for instructing the operation of the test circuit from outside of the chip, however, this test terminal is not used in normal operation.

Concerning the problem of No. 1, as a recent tendency, the gate scale becomes larger and the area of the test circuit is sufficiently small in comparison to the area of the gate array. Therefore, the area of the test circuit has only a small influence on the increase in chip size, and this problem is now not so important.

Moreover, concerning the problem of No. 2, the influence of the test circuit becomes smaller together with an enlarged and complicated gate scale, and also this problem is now not so important.

In contrast thereto, the problem of No. 3 arises independently of the gate scale, and no effective solutions have been found yet.

That is, the test terminal for shipping inspection is used only for test, and in mounting onto the print circuit substrate, there is only a bad influence that the portions to be soldered increase, thereby making the work complicated. Moreover, there arise problems that the size of a package becomes larger and that there is a possibility of causing soldering troubles in mounting due to the increasing number of the external terminals of the package.

Moreover, it is typical that each manufacturer uses a differently composed test circuit. Therefore, when a user ordered the same gate array product to two different manufacturers, the gate array products shipped from the manufacturers may have different appearances (due to an unnecessary test terminal or the like), what causes a serious hindrance when the user uses these products.

From such reasons, in the gate array, it has been decided after consulting with the user, whether a test circuit for an easy test should be loaded in the chip or not. However, users have usually a tendency of not preferring such a test circuit from the reasons as described above and, therefore, in nearly every case no test circuit for an easy test is loaded in the chip in the current condition of the gate array.

However, the test terminal makes a major contribution to the rationalization on the part of the manufacturers because it can realize an automated design in designing the test circuit and can standardize test devices used for shipping inspection on the part of the manufacturers if it can be specified to a specific terminal (specific pin) of the package of a LSI.

Therefore, the manufactures are looking forward to realize a technique permitting the test circuit for an easy test to be loaded without imposing a burden upon users.

BRIEF SUMMARY OF THE INVENTION

The object of the present invention is, therefore, firstly to propose a gate array having a perfect interchangeability with a FPGA and secondly to load a test circuit for an easy test in the chip without causing demerits to users by using the gate array having interchangeability with the EPGA.

The interchangeable FPGA-GATE ARRAY is provided with a first external terminals disposed at the same positions of second external terminals of a FPGA and a gate array chip having a test circuit, and a position of a terminal for controlling the test circuit among the first external terminals is the same as a position of a data program terminal of the FPGA among the second external terminals.

The method of producing the interchangeable FPGA-GATE ARRAY according to the present invention is applied to a case in which a system is developed by using a FPGA and the system is mass-produced by using a gate array, and it comprises a series of steps of forming a logic LSI in a FPGA chip by using a data program terminal of the package of the FPGA, of forming the logic LSI and a test circuit in a gate array chip by using a wiring mask, of containing the gate array chip in which the logic LSI and the test circuit are formed in the package of the FPGA, and of using the data program terminal of the package of the FPGA as a test terminal for controlling the test circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An interchangeable FPGA-GATE ARRAY having a test circuit for an easy test of the present invention will be described below in detail with reference to the accompanying drawing.

1. Interchangeable FPGA-GATE ARRAY

First, the interchangeability between FPGA and gate array will be described.

1.-1. Outline

As described in the prior art, the users use a FPGA which allows the period from design to completion of a product to be short, in perspective of reducing development costs in a trial production stage and, they use a gate array in which the unit price of a chip is low, on purpose to reduce mass production costs in a mass production stage. However, this is based upon the assumption that there is interchangeability between FPGA and gate array.

In general, when a FPGA includes no special buffer (for example, input/output buffer of LVDS type of which characteristics are strictly specified and of which functions cannot be changed by means of a program), a logic LSI based upon the FPGA can be reproduced in a gate array by changing a wiring mask (that is, an aluminum wiring pattern). That is, an already designed and developed logic LSI can be realized in a FPGA by means of a program, and further, a logic LSI of the same design can be realized in a gate array by changing the wiring mask.

However, when a FPGA includes a special buffer, it is too difficult to realize an input/output buffer having substantially the same characteristics as the special input/output buffer in a gate array. For a plurality of products use a common DW in the gate array And, a desired logic LSI is realized by changing the wiring mask freely and therefore, it is practically impossible to form a buffer of the same structure, size and layout as the structure, size and layout of the special input/output buffer of the FPGA in a gate array chip.

So, in the present invention, a portion of a plurality of input/output buffers before a wiring process formed in the DW of the gate array is adapted to have substantially the same structure, size and layout as the structure, size and layout of the special input/out buffer of the FPGA. As a result thereof, by using the DW, the special input/output buffer can be realized in the gate array chip, whereas only the wiring process carried out.

Thus, for example, development of a logic LSI makes it possible to realize trials of production using FPGAs and mass production using gate arrays.

Further, in general, since a print circuit board is developed and the positions of the external terminals such as power source, I/O and the like are fixed in the trial production stage, a DW of the gate array is also developed corresponding thereto. That is, it is preferable that the position at which the special input/output buffer is disposed in the gate array chip corresponds to the position at which the special input/output buffer is disposed in the FPGA.

1.-2. Embodiments

Figure 1:
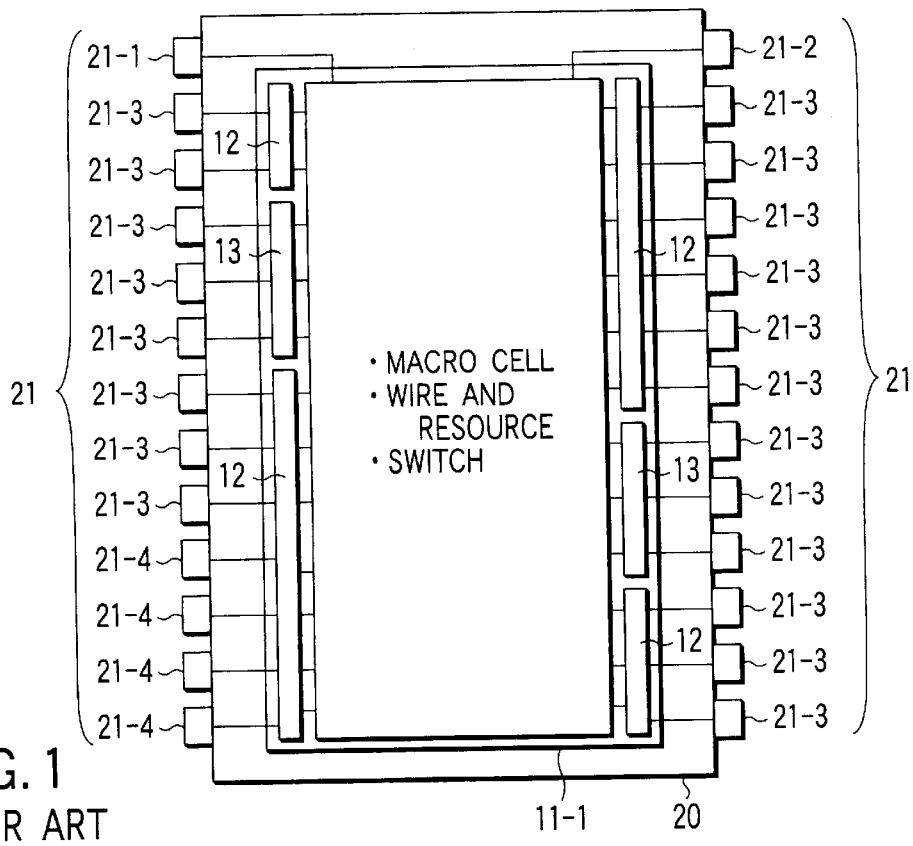
FIG. 1 is a schematic view showing a conventional FPGA.
Figure 2:
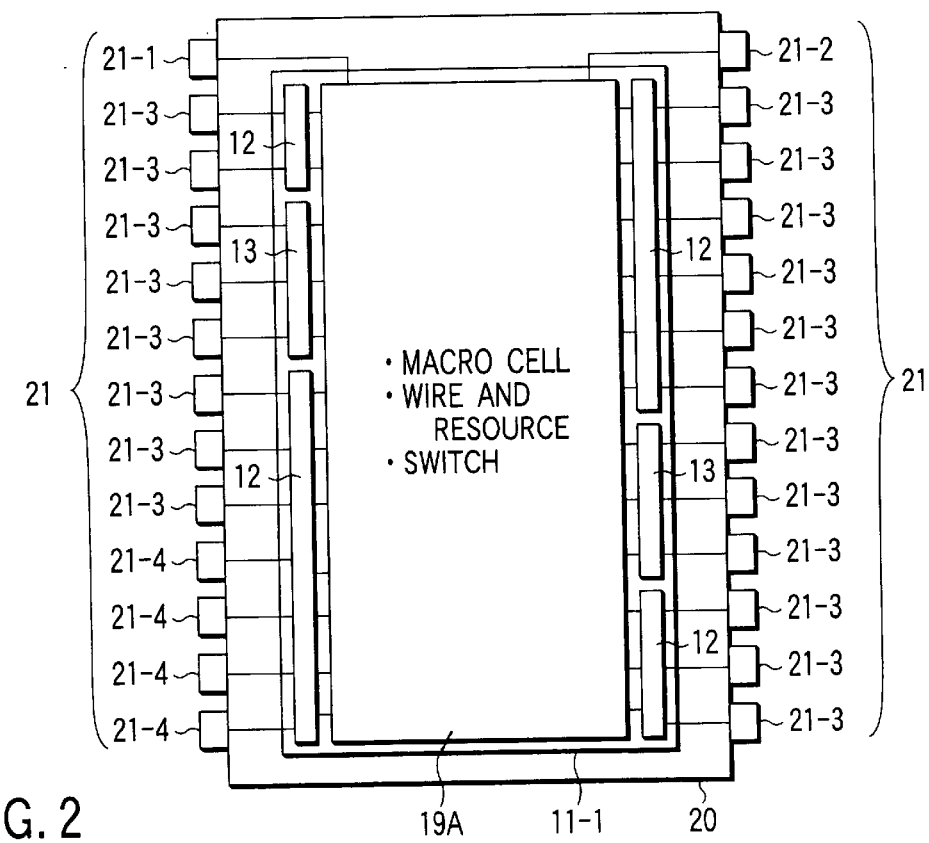
FIG. 2 is a schematic view of a FPGA upon which the present invention is based.

FIG. 2 is a schematic view of a FPGA upon which a gate array of the present invention is based.

20 represents a package. Around the package 20 a plurality of external terminals 21 are disposed. In this embodiment, the package 20 is one on the two opposite sides of which the external terminals 21 are mounted (DIP, SOP, SOJ and the like), however, naturally the present invention can be applied also to other kinds of package (QFP, BGA, PGA and the like).

A FPGA chip 11-1 is disposed in the package 20. The FPGA chip 11-1 and the external terminals 21 are connected electrically to each other. The electrical connection between the FPGA chip 11-1 and the external terminals 21 may be carried out by means of bonding wires or a TAB technique.

In the FPGA chip 11-1, an internal circuit 19A including a micro cell, a wire and resource, and a switch and, I/O cells 12 and 13 are disposed. The micro cell is a circuit block of which specified functions have been realized in advance, and the resource is a calculation resource (calculator, register and the like).

In the center of the FPGA chip 11-1, an internal circuit 19A including a micro cell, a wire and resource, and a switch is disposed in a specified layout, and on the peripheral portion of the FPGA chip 11-1, the I/O cells 12 and 13 are disposed. And a desired logic LSI can be realized in the FGPA 11-1 by programming.

The input/output buffers disposed in the FPGA chip 11-1 are divided into one composed of a standard I/O cell 12 and one composed of a special I/O cell 13. The standard I/O cell 12 can change the functions thereof by programming thereby to compose almost every input/output circuit. On the contrary, the structure, size and layout thereof are completely fixed and the special I/O cell 13 cannot change the functions thereof by means of a program,. For example, the input/output buffer of LVDS type is realized by means of the special I/O cell 13.

Figure 3:
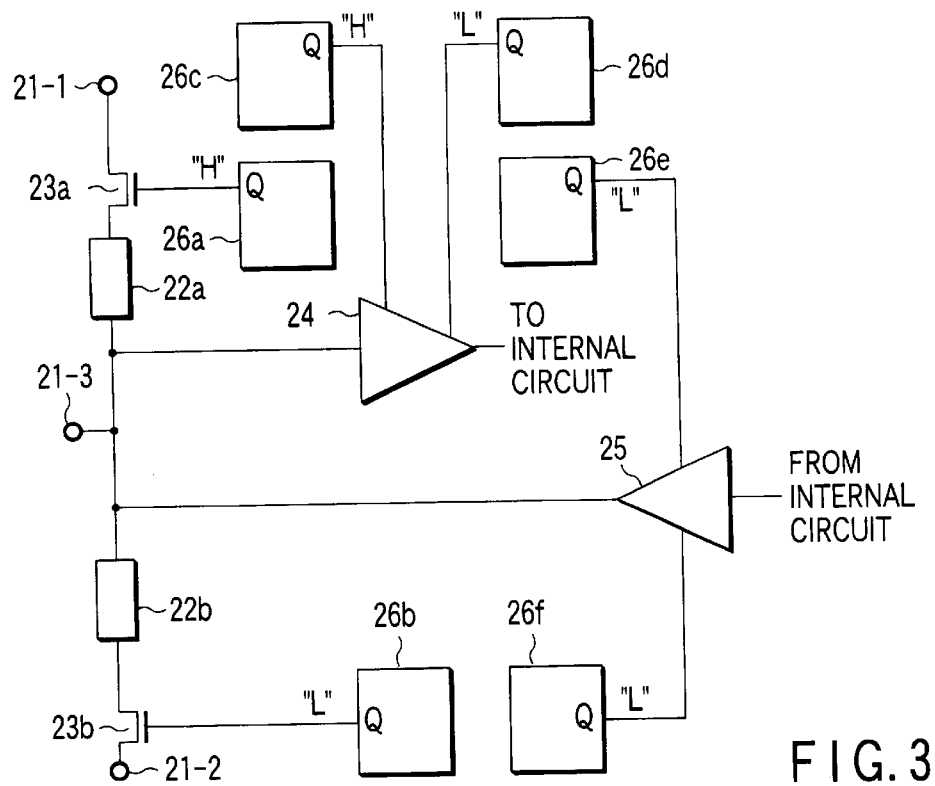
FIG. 3 is a view showing an example of an I/O cell in the FPGA of FIG. 2.

FIG. 3 shows an example of the circuit of the standard I/O cell in the FPGA chip.

A data input/output pin (I/O pin) 21-3 is connected to the input node of an input buffer 24 and the output node of an output buffer 25. Moreover, between a power source terminal (VDD pin) 21-1 and a data input/output terminal 21-3, a pull-up resistor 22a and a pull-up control transistor 23a are connected in series. Between a grounding terminal (GND pin) 21-2 and a data input/output terminal 21-3, a pull-down resistor 22b and a pull-down control transistor 23b are connected in series.

The gate of the pull-up control transistor 23a is connected to the output node Q of a pull-up control register 26a. When the output signal of the pull-up control register 26a is "H (High)", the pull-up control transistor 23a comes into ON-state, and the power source terminal 21-1 and the input node of an input buffer 24 are connected electrically to each other via the pull-up resistor 22a.

Similarly, the gate of the pull-down control transistor 23b is connected to the output node Q of a pull-down control register 26b. When the output signal of the pull-down control register 26b is "H (High)", the pull-down control transistor 23b comes into ON-state, and the grounding terminal 21-2 and the input node of an input buffer 24 are connected electrically to each other via the pull-down resistor 22b.

The input buffer 24 is connected to the output node Q of a TTL/CMOS level specifying register 26c. When the output signal of the TTL/CMOS level specifying register 26c is "H", the circuit threshold value of the input buffer 24 is set to the TTL level, and when the output signal of the TTL/CMOS level specifying register 26c is "L (Low), the circuit threshold value of the input buffer 24 is set to the CMOS level.

Moreover, the input buffer 24 is connected to the output node Q of a delay control register 26d. The value of the output signal of the delay control register 26d determines the delay time (time from input to output of a signal) of the input buffer 24.

The output buffer 25 is connected to the output node Q of an ENABLE control register 26e. When the output signal of the ENABLE control register 26e is "H", the output buffer 25 comes into an operating (enable) state, and when the output signal of the ENABLE control register 26e is "L", the output buffer 25 comes into a non-operating (disable) state.

Moreover, the output buffer 25 is connected to the output node Q of a through-rate control register 26f. The through-rate control register 26f controls the rise/fall time of the signals outputted from the output buffer 25. When the output signal of the through-rate control register 26f is "L", the rise/fall time is normal and, when the output signal of the through-rate control register 26f is "H", the rise/fall time is longer than the normal rise/fall time.

Further, the values of these registers 26a, 26b, 26c, 26d, 26e and 26f are determined by programming data into the registers 26a, 26b, 26c, 26d, 26e and 26f respectively in the configuration process immediately after throwing the power in.

Figure 4:
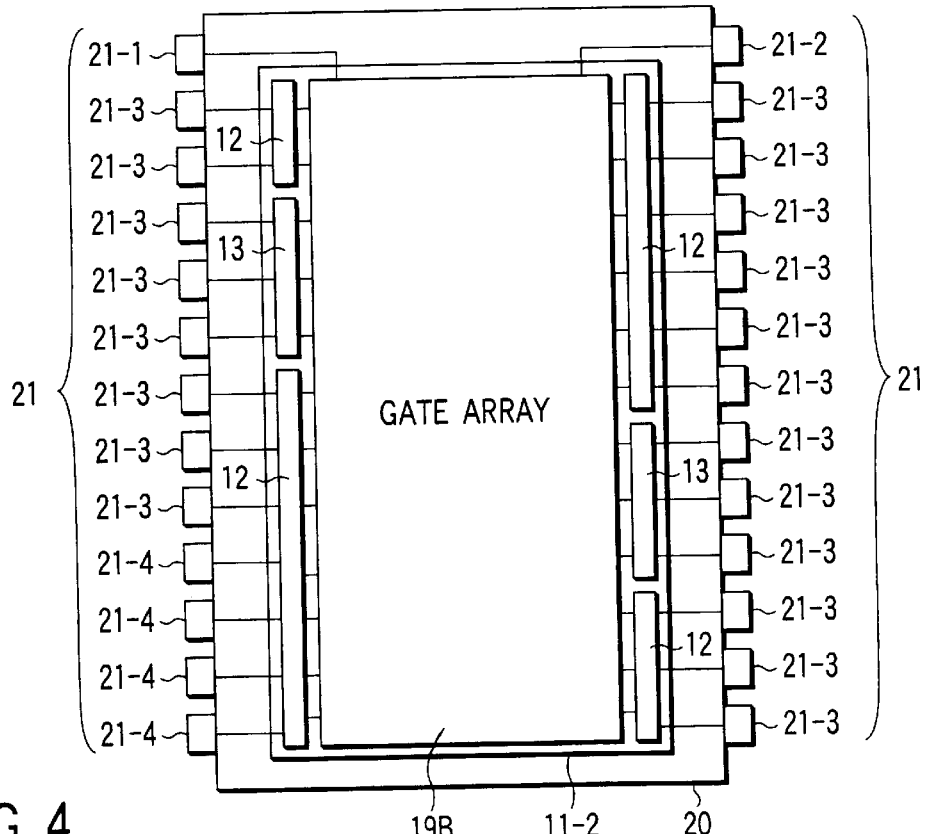
FIG. 4 is a schematic view showing a gate array of the present invention based upon the FPGA of FIG. 2.

FIG. 4 is a schematic view showing an INTERCHANGEABLE FPGA-GATE ARRAY according to the present invention.

The gate array according to the present invention is characterized in that a buffer having the same characteristics as the special input/output buffer of the FPGA is formed in the gate array chip. That is, the structure, size and layout of the special I/O cell 13 in the FPGA chip 11-1 of FIG. 2 are set to substantially the same as the structure, size and layout of the special I/O cell 13 in the gate array chip 11-2.

As a result thereof, only by setting the wiring mask used in the wiring process of the gate array to a specified pattern, the special input/output buffer realized by means of the FPGA can be realized by means of the gate array without changing the characteristics thereof.

In this embodiment, the positions of the I/O cells 12 and 13 in the gate array chip 11-2 correspond completely to the positions of the I/O cells 12 and 13 in the FPGA chip 11-1 shown in FIG. 2, so that it facilitates a development of the wiring mask used in the wiring process of the gate array.

For example, when a FPGA is used and a print circuit has been already developed in the trail production stage, and when a gate array is used in the mass production stage, the positions thereof are already fixed (that is, the same as the positions of the external terminals of the FPGA). That is, as the package 20, the same one as the package 20 of the FPGA shown in FIG. 2 is used, and further, the arrangement of the external terminals 21, that is, the arrangement of the power source terminal 21-1, the grounding terminal 21-2 and the input/output terminals 21-3 and 21-4 is the same as the arrangement of the external terminals 21 of the FPGA shown in FIG. 2.

Accordingly, if the positions of the I/O cells 12 and 13 in the gate array chip 11-2 correspond completely to the positions of the I/O cells 12 and 13 in the FPGA chip 11-1 shown in FIG. 2, a logic LSI designed and developed in a FPGA can be easily reproduced (manufactured) in a gate array.

Further, in this embodiment, the position of the special I/O cell 13 is the same as the position of the special I/O cell 13 shown in FIG. 2, while in the present invention, the position of the special I/O cell 13 may be different from the position of the special I/O cell 13 shown in FIG. 2 as long as the position (function) of each external terminal 21 is not different from the position (function) of each external terminal 21 of the FPGA.

Figure 5:
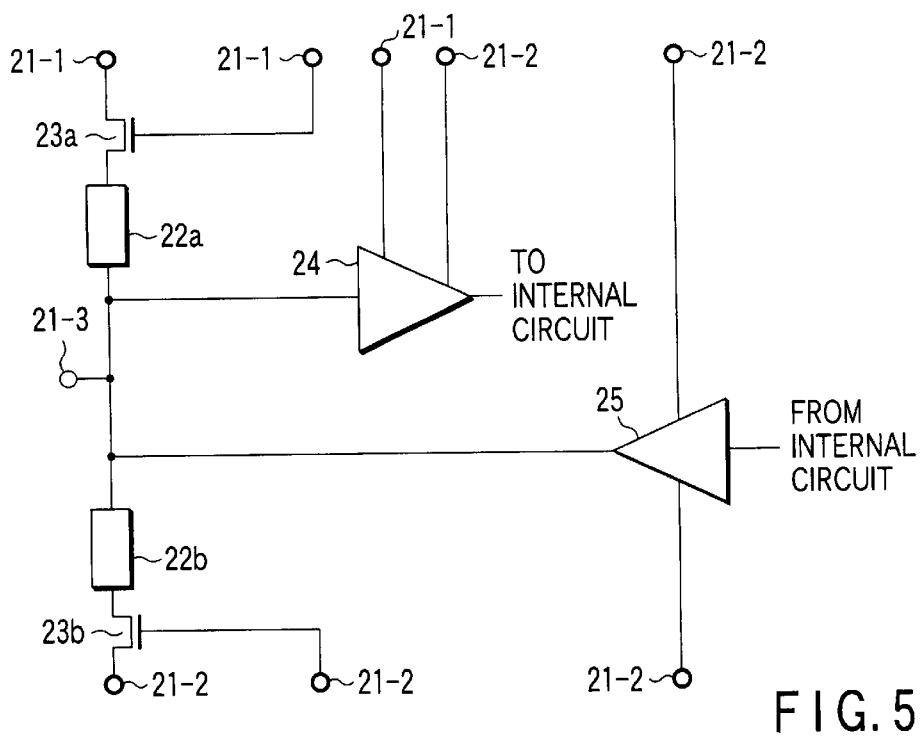
FIG. 5 is a view showing an example of an I/O cell in the gate array of FIG. 4.

FIG. 5 shows an example of the circuit of the standard I/O cell in the gate array chip.

First, as prerequisites, the circuit realized by means of the standard I/O cell in the FPGA of FIG. 2 shall be an input buffer, and further, the level of the output signal of each register 26a, 26b, 26c, 26d, 26e and 26f in the standard I/O cell of FIG. 3 shall be set as shown in the same figure.

The basic circuit in the standard I/O cell of the gate array is substantially the same as the basic circuit in the standard I/O cell of the FPGA of FIG. 3. However, in the standard I/O cell of the gate array, there are provided no circuits corresponding to the registers 26a, 26b, 26c, 26d, 26e and 26f provided in the standard I/O cell of FIG. 3.

That is, in the gate array, the value ("H" or "L") of the output signal of each register 26a, 26b, 26c, 26d, 26e or 26f disposed in the standard I/O cell, the FPGA of FIG. 3 is realized by means of a metallic wire (for example, aluminum wire), the power source terminal 21-1 and the grounding terminal 21-2.

For example, in the wiring process of the gate array, the gate of the pull-up transistor 23a is connected to the power source terminal 22-1 by means of a metallic wire so as to impress "H" on the gate, and the gate of the pull-down transistor 23b is connected to the power source terminal 22-2 by means of a metallic wire so as to impress "L" on the gate.

Now, a gate array of FIG. 5 having interchangeability with the FPGA of FIG. 3 will be described specifically.

The data input/output terminal (I/O pin) 21-3 is connected to the input node of an input buffer 24 and the output node of an output buffer 25. Moreover, between a power source terminal (VDD pin) 21-1 and a data input/output terminal 21-3, a pull-up resistor 22a and a pull-up control transistor 23a are connected in series. Between a grounding terminal (GND pin) 21-2 and a data input/output terminal 21-3, a pull-down resistor 22b and a pull-down control transistor 23b are connected in series.

Up to this point the situation is the same as in the FPGA of FIG. 3.

Here, the gate array is characterized in that the metallic wiring pattern (or wiring mask) can be changed freely. By utilizing this characteristic, the registers 26a, 26b, 26c, 26d, 26e and 26f of the FPGA of FIG. 3 can be omitted. That is, in the gate array, the value ("H" or "L") of the output signal of each register 26a, 26b, 26c, 26d, 26e or 26f of the FPGA of FIG. 3 can be realized by means of the power source terminal (corresponding to "H")22-1 and the grounding terminal (corresponding to "L")22-2.

So, in this embodiment, the gate of the pull-up control resistor 23a is connected to the power source terminal 21-1, the gate of the pull-down control resistor 23b is connected to the grounding terminal 21-2, the TTL/CMOS level specifying register of the input buffer 24 is connected to the power source terminal 21-1, the delay control terminal of the input buffer 24 is connected to the grounding terminal 21-2, the ENABLE control terminal of the output buffer 25 is connected to the grounding terminal 21-2, and the through-rate control terminal of the output buffer 25 is connected to the grounding terminal 21-2.

1.-3. Summary

As described above, according to the present invention, a buffer having substantially the same characteristics (structure, size and layout) as the characteristics (structure, size and layout) of the special input/output buffer of the FPGA is formed in the DW of the gate array before wiring process. As a result thereof, a special I/O cell can be disposed also in the gate array chip only by means of wiring process. Accordingly, the special input/output buffer realized in the FPGA can be realized in the gate array only by means of wiring process, and the interchangeability between FPGA and gate array can be secured.

Conventionally, when a FPGA was replaced with an ASIC, an ASIC which allows free design ranging from substrate process to wiring process was required, however, in the present invention, a FPGA can be replaced with a gate array of which substrate process is common and which permits free design only in wiring process. Therefore, in the present invention, design, masks and production are standardized to achieve reduced development cost, a shortened development period and a shortened production period in developing logic LSIs.

2. Interchangeable FPGA-GATE ARRAY Containing a Test Circuit for an Easy Test

Now, an interchangeable FPGA-GATE ARRAY containing a test circuit for an easy test will be described.

2.-1. Outline

The present invention is based upon an interchangeable FPGA-GATE ARRAY. That is, the present invention is applied to users who have already finished the design of a logic LSI, for instance, such as a trial production stage to realize this logic LSI by using a FPGA and further wish to produce a logic LSI by using a gate array instead of a FPGA for reasons of cost and the like.

The FPGA switches the wires connected to the gates by means of a program, thereby to realize a logic LSI desired by a user. Usually, in order to control the switching of the wires, the FPGA chip contains a memory. And, based upon data programmed in the memory, the connection and disconnection of the wires concerning the data are controlled.

Moreover, the FPGA has a data program terminal (external terminal) in order to program data for realizing a logic LSI into the memory in the chip from outside of the chip. This data program terminal is indispensable in the FPGA.

However, when this FPGA is replaced with a gate array (for example one shown in FIGS. 4 and 5) that maintains an interchangeability with the FPGA, no memory is required in the chip and, accordingly the data program terminal is no longer required.

Now, on the part of a user, in general, at the stage of a trial of the logic LSI by means of a FPGA, a print circuit board has been developed simultaneously, which means the positions of the external terminals of the package (the functions of the terminals, for example, for use of power source, for use of I/O and the like) has been already determined.

Accordingly, when this FPGA is replaced with a gate array which maintains interchangeability with the FPGA, the data program terminal is no longer required, however, the position of each external terminal of the package must be the same as the position of each external terminal of the FPGA.

That is, also in the gate array, the data program terminal must remain as it is.

According to the present invention, in such an interchangeable FPGA-GATE ARRAY, the unnecessary data program terminal is used as a test terminal for controlling a test circuit for an easy test.

As described above, by using the data program terminal in the FPGA as a test terminal in the gate array, the gate array chip can contain a test circuit that has realized an easy test, thereby to achieve a simplified shipping inspection and a shortened test time. Moreover, since the position of the data program terminal is fixed (already determined), the facilitated and automated design of a test circuit, the automatic production of a test program, and the standardization of a test device can simultaneously be realized in the gate array. That is, this allows rationalization on the side of the manufacturers.

Moreover, on the part of users, regardless of whether a test circuit is contained in the gate array chip or not, the data program terminal remains as it is, and therefore, no burden increases on the part of users in mounting or the like.

Further, without saying, the present invention can be applied to a usual interchangeable FPGA-GATE ARRAY having no special I/O cell in addition to the interchangeable FPGA-GATE ARRAY described in FIGS. 2 to 5.

2.-2. Embodiments

Figure 6:
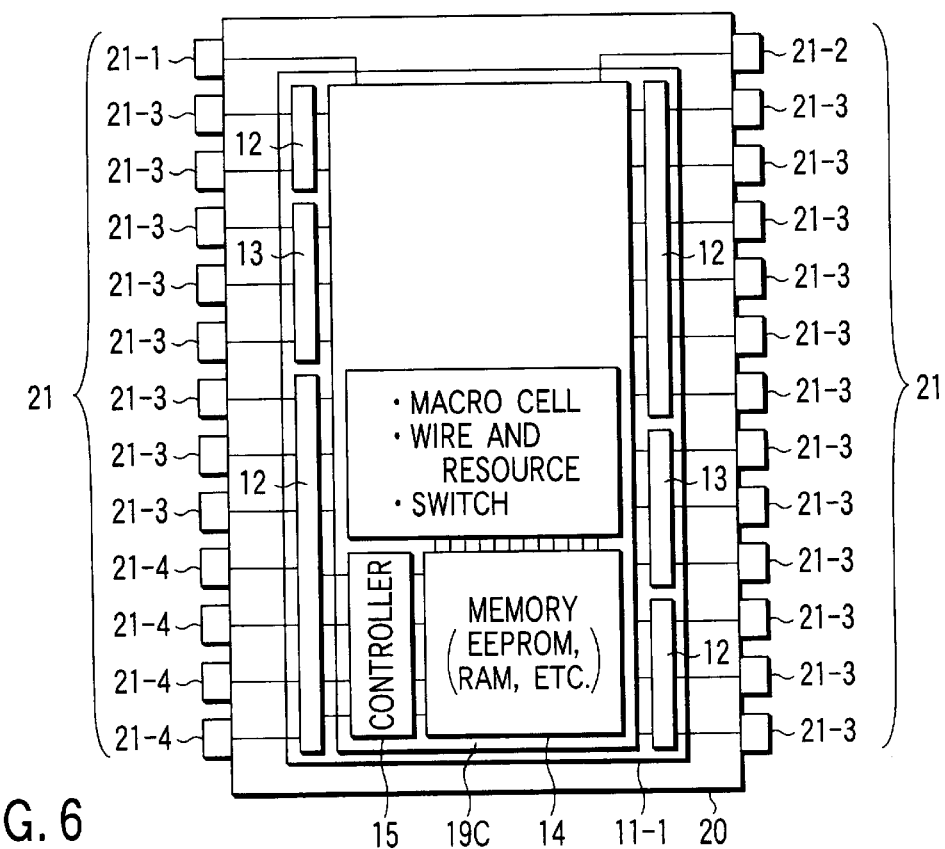
FIG. 6 is a schematic view of a FPGA upon which the present invention is based.

FIG. 6 is a schematic view of a FPGA upon which a gate array of the present invention is based.

Around a package 20 a plurality of external terminals 21 are disposed. In this embodiment, the package 20 is one on the two opposite sides of which the external terminals 21 are mounted (DIP, SOP, SOJ and the like), while the present invention can naturally be applied also to other kinds of package (QFP, BGA, PGA and the like).

A FPGA chip 11-1 is disposed in the package 20. The FPGA chip 11-1 and the external terminals 21 are connected electrically to each other. The electrical connection between the FPGA chip 11-1 and the external terminals 21 may be carried out by means of bonding wires or a TAB technique.

In the FPGA chip 11-1, an internal circuit 19C including a micro cell, a wire and resource, a switch, a memory 14 and a controller 15, and I/O cells 12 and 13 are disposed. The memory (EEPROM, RAM or the like) 14 and the controller (for example, JTAG controller) 15 are provided in order to realize a desired logic LSI in the FPGA chip 11-1 by programming data into the memory 14.

In this embodiment, a standard I/O cell 12 and a special I/O cell 13 are disposed around the FPGA chip 11-1. That is, the input/output buffers disposed in the FPGA chip 11-1 are divided into one composed of a standard I/O cell 12 and one composed of a special I/O cell 13. However, as described below, the FPGA chip 11-1 may have only a standard I/O cell 12.

The outer terminals includes, for example, a power source terminal (VDD pin) 21-1, a grounding terminal (GND pin) 21-2, a data input/output terminal (I/O pin) 21-3 and a data program terminal 21-4.

The power source terminal 21-1 is provided to supply the FPGA chip 11-1 with a power source potential VDD, and the grounding chip 21-2 is provided to supply the FPGA chip 11-1 with a grounding potential VGND. The data input/output terminal 21-3 is a terminal for inputting/outputting data and is connected to the I/O cell sections 12 and 13. The data program terminal 21-4 is provided to program data into the memory 14 via the controller 15.

And according to the data programmed in the memory 14 a logic LSI desired by a user is realized in the FPGA chip 11-1. Moreover, according to the data programmed in the memory 14, the function of the I/O cell section 12 is determined, that is, it is determined whether the I/O cell section 12 is used as an input buffer, as an output buffer or as an input/output buffer. Simultaneously, the function of the external terminal 21-3 is determined, that is, it is determined whether the external terminal 21-3 is used as a data input pin, as a data output pin or as a data input/output pin.

Now, a case in which the above-described FPGA is replaced with a gate array will be discussed. To use a gate array whose price is lower than a FPGA on per-chip basis is more advantageous in the aspect of the cost when a development of the system with use of a FPGA is succeeded and the system is mass-produced.

Since a system using a FPGA has already been developed, also a print circuit board has already been developed, and therefore, the functions required to the gate array are completely the same as the functions of the FPGA. However, since the internal circuit is realized by means of metallic wiring using a wiring mask, the memory 14 used in the FPGA becomes unnecessary.

Accordingly, when the FPGA of FIG. 6 is replaced with a gate array, the data program terminal 21-4 becomes unnecessary. So, in the gate array interchangeable with the FPGA, this unnecessary data program terminal 21-4 is used as a test terminal.

Figure 7:
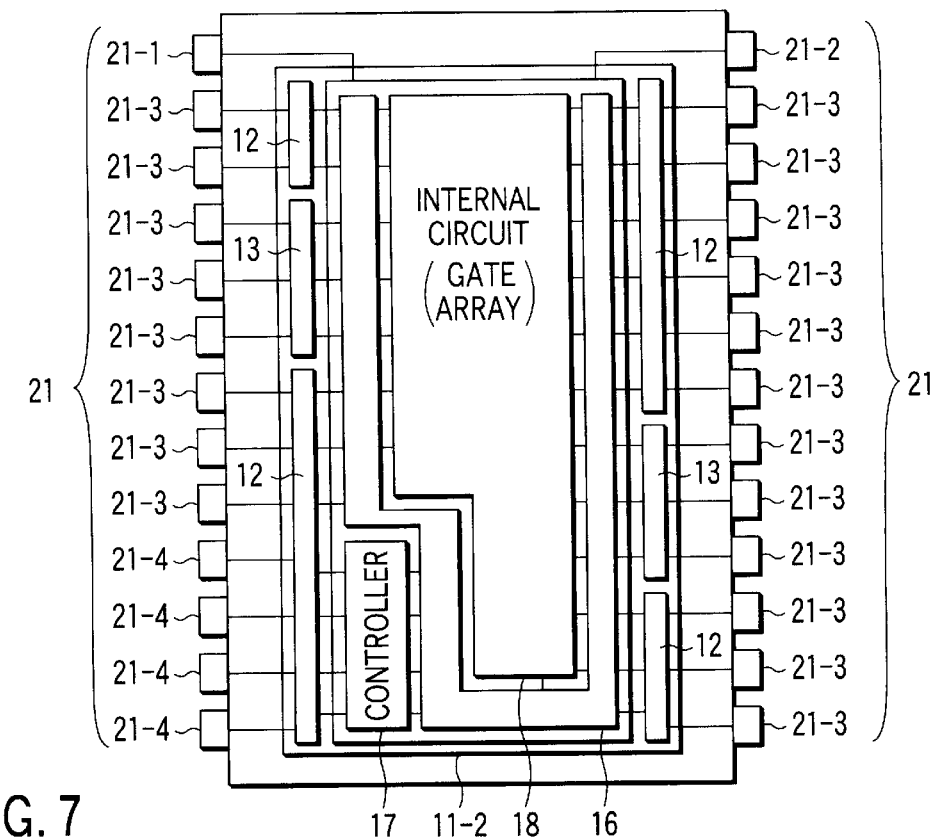
FIG. 7 is a schematic view showing a gate array of the present invention based upon the FPGA of FIG. 6.

FIG. 7 is a schematic view showing an INTERCHANGEABLE FPGA-GATE ARRAY containing a test circuit according to the present invention.

Since the print circuit board has been already developed, as the package 20, the same one as the package 20 of the FPGA of FIG. 6 is used, and further, the arrangement of the plurality of external terminals 21 is the same as the arrangement of the plurality of external terminals 21 of the FPGA of FIG. 6.

The gate array chip 11-2 is disposed in the package 20. The gate array chip 11-2 and the external terminals 21 are connected electrically to each other. The electrical connection between the FGPA gate array chip 11-2 and the external terminals 21 may be carried out by means of bonding wires or a TAB technique.

In the gate array chip 11-2 a boundary scan circuit 16, a controller 17 and an internal circuit (gate array) 18 are disposed. The boundary scan circuit 16 is provided for an easier test in testing the internal circuit 18 and the overall system. Further, since the boundary scan circuit 16 itself is well-known, the description thereof will be omitted.

The controller (for example, JTAG controller) 17 controls the boundary scan circuit 16. Moreover, it is necessary to input control signals into the boundary scan circuit 16 from outside of the chip 11-2 via the controller 17. Therefore, in the present invention, the external terminal 21-4 having become unnecessary when the FPGA was replaced with a gate array is used as a test terminal.

The test terminal 21-4 includes, for example, a TCK pin, a TMS pin, a TDI pin and a TDO pin. The TCK (Test Clock) pin is a clock terminal for inputting a test clock. The TMS (Test Mode Select) pin is a terminal for inputting a test signal in order to recognize the test mode in test mode. The TDI (Test Data Input) pin is a data input terminal for inputting test instructions and test data serially. The TDO (Test Data Output) pin is a data output terminal for outputting test instructions and test data.

Moreover, optionally a TRST (Test Reset) pin for initializing a test logic asynchronously with the test clock may be further provided.

And, in a test, for example, the data inputted from the data input/output terminal 21-3 or the test terminal (TDI pin) 21-4 are inputted into the internal circuit 18 via the boundary scan circuit 16. Moreover, the data processed in the internal circuit 18 are outputted onto the data input/output 21-3 or the test terminal (TDO pin) 21-4 via the boundary scan circuit 16.

Thus, in the FPGA-interchangeable gate array of the present invention, the data program terminal that has become unnecessary when the FPGA was replaced with the gate array is used as a test terminal 21-4 for controlling the boundary scan circuit 16. Accordingly, without increasing any burden on the part of users, the boundary scan circuit 16 for an easy test can be contained in the gate array chip. Moreover, since the test circuit for an easy test can be contained in the chip, a simplified shipping inspection and a shortened test time can be achieved.

Moreover, since the position of the test terminal 21-4 is fixed (already determined), it contributes facilitation, automation and standardization of designs of the boundary scan circuit 16 and the controller 17, and automatic production of a test program, and further the standardization of a test device.

Further, the number of test terminals required for the gate array chip to contain the test circuit varies according to the type of test circuit, however, is usually one or more. On the contrary, the number of data program terminals of FPGA is usually more than one. That is, if the number of test terminals is equal to or less than the number of data program terminals of FPGA (unnecessary external terminals) in the gate array, no burden is imposed on users even if a test circuit for an easy test is provided.

Now, in this embodiment, corresponding to the FPGA of FIG. 6, a standard I/O cell 12 and a special I/O cell 13 are disposed around the gate array chip 11-2. In this case, it is necessary to prepare a DW for gate array having I/O cells 12 and 13 corresponding to the I/O cells 12 and 13 of the FPGA of FIG. 6.

Figure 8:
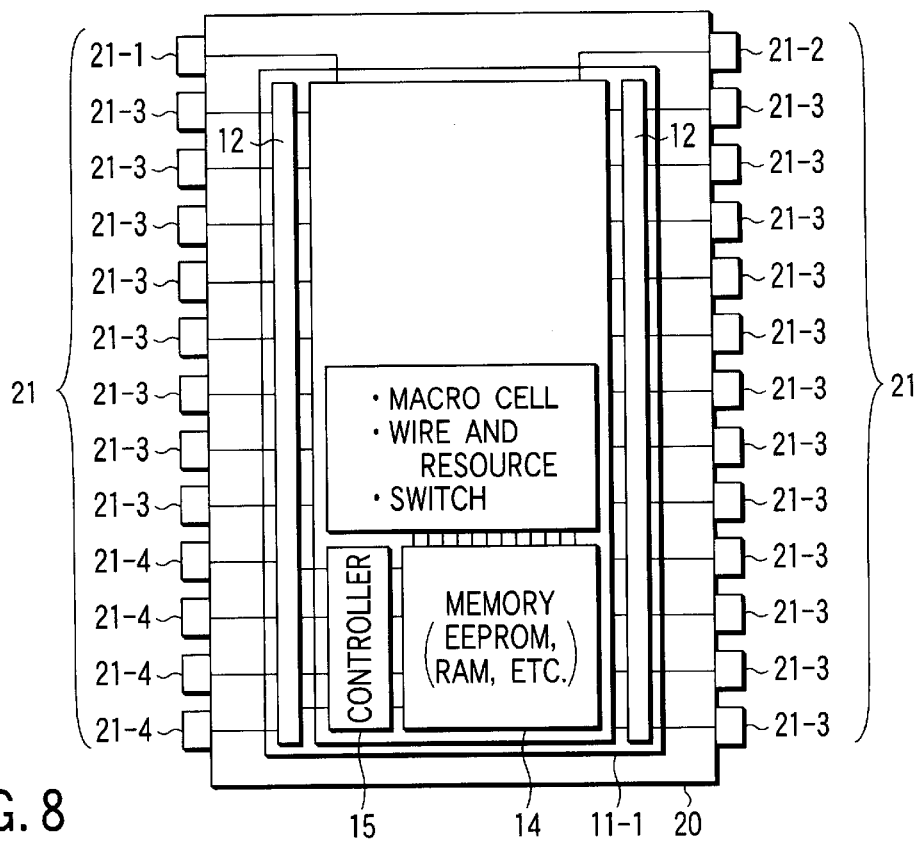
FIG. 8 is a schematic view of a FPGA upon which the present invention is based.
Figure 9:
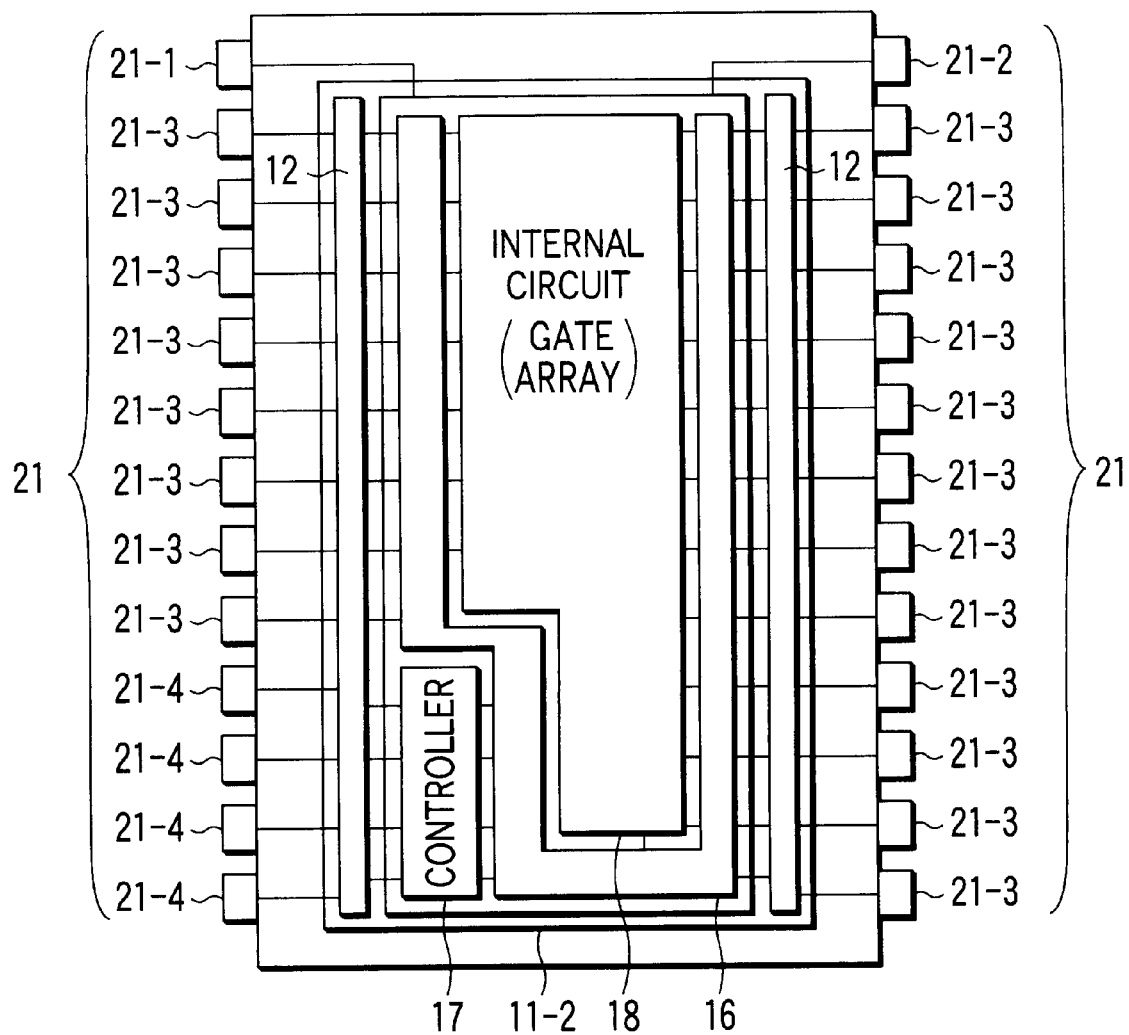
FIG. 9 is a schematic view showing a gate array of the present invention based upon the FPGA of FIG. 8.

However, the present invention may be applied to a usual gate array (FPGA-interchangeable gate array). For example, for the FPGA as shown in FIG. 8, the gate array as shown in FIG. 9 can be provided. The embodiment of FIG. 8 and FIG. 9 differs from the embodiment of FIG. 6 and FIG. 7 in that the device of FIG. 8 and FIG. 9 has not the special I/O cell 13 of FIG. 6 and FIG. 7.

2.-3. Summary

Thus, according to the present invention, an external terminal having become unnecessary when the FPGA was replaced with a gate array is used as a test terminal for controlling the test circuit. Accordingly, when a system is developed by using a FPGA and the system is mass-produced by using a gate array, the test circuit can be contained in the gate array chip without increasing any burden on the part of users.

Moreover, when the system has been already developed, also a print circuit board has been already developed, and the position of the test terminal will be specified. Accordingly, when a test circuit is designed in the gate array, a facilitated, automated and standardized design, an automatically produced test program, and further a standardized test device can be achieved.

As described above, according to the present invention, the following advantageous can be obtained.

Firstly, when the FPGA is replaced with an ASIC, a DW having a buffer that is substantially the same structure, size and layout as these of the special input/output buffer of the FPGA, thereby to make the mask design of all the layers unnecessary and, as a result, the logic LSI using the FPGA can be realized by using a gate array. Accordingly, a shortened system development period and a reduced development cost can be achieved simultaneously.

Secondly, when users wish to reduce the development cost in system development by replacing the FPGA with an ASIC, a test circuit can be provided in the chip without imposing any burden on users by using the data program terminal of the FPGA as s test terminal for a gate array. Moreover, since the position of the test terminal is specified, a facilitated, automated and standardized design, an automatically produced test program, and further a standardized test device can be achieved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An interchangeable FPGA-GATE ARRAY comprising:

first external terminals disposed at positions corresponding to positions of second external terminals of a FPGA; and a gate array chip having a test circuit;

wherein a position of a terminal for controlling said test circuit among said first external terminals corresponds to a position of a data program terminal of said FPGA among said second external terminals, and wherein, when a special buffer of which characteristics are strictly specified and of which functions cannot be changed by a program is provided in said FPGA, a buffer having substantially the same characteristics as the characteristics of said special buffer is provided also in said gate array.

2. The interchangeable FPGA-GATE ARRAY according to claim 1, wherein a function of a third external terminal other than the data program terminal of said FPGA among said second external terminals is the same as a function of a fourth external terminal corresponding to said third external terminal among said first external terminals.

3. The interchangeable FPGA-GATE ARRAY according to claim 1, wherein said test circuit includes a boundary scan circuit.

4. A manufacturing method of an interchangeable FPGA-GATE ARRAY when developing a system by using a FPGA and mass-producing said system by using a gate array, comprising steps of:

forming a logic LSI in a FPGA chip by using a data program terminal of a package of said FPGA;

forming said logic LSI and a test circuit in the gate array chip by using a wiring mask;

containing said gate array chip in which said logic LSI and said test circuit are formed in the package of said FPGA;

using said data program terminal of the package of said FPGA as a test terminal for controlling said test circuit.

5. The manufacturing method according to claim 4, wherein, at the time of having finished the development of said system by using said FPGA, also a print circuit board equipped with said interchangeable FPGA-GATE ARRAY has been already developed, and subsequently, said logic LSI and said test circuit are formed in said gate array chip.

6. The manufacturing method according to claim 4, wherein, when a special buffer of which characteristics are strictly specified and of which functions cannot be changed by means of a program is provided in said FPGA, a wafer before a wiring process including the same buffer as said special buffer is prepared in advance, and logic LSI is realized by forming said special buffer in said wafer by means of said wiring process.

7. The manufacturing method according to claim 4, wherein said test circuit includes a boundary scan circuit.

8. The manufacturing method according to claim 4, wherein data are written into a memory in the FPGA chip by using said data program terminal and a logic LSI is formed in said FPGA chip.

9. The manufacturing method according to claim 8, wherein said data are written into said memory by using a controller in said FPGA chip.

10. The manufacturing method according to claim 9, wherein said controller is disposed also in said gate array chip.

11. The manufacturing method according to claim 10, wherein said controller is used to control said test circuit.

* * * * *